United States Patent [19]
Keller et al.

[11] Patent Number: 4,705,608
[45] Date of Patent: Nov. 10, 1987

[54] PROCESS FOR MAKING SCREEN PRINTING FABRICS FOR SCREEN PRINTING CYLINDERS

[75] Inventors: Heinz Keller; Heinz Brocker; Martin Lehner, all of St. Gall, Switzerland

[73] Assignee: Ferd Ruesch AG, St. Gall, Switzerland

[21] Appl. No.: 797,640

[22] Filed: Oct. 13, 1985

[30] Foreign Application Priority Data

Nov. 14, 1984 [DE] Fed. Rep. of Germany ....... 3441593

[51] Int. Cl.[4] ................................................ C25D 7/00
[52] U.S. Cl. ...................................... 204/28; 204/38.1
[58] Field of Search ................... 204/11, 24, 28, 38.1, 204/38.7

[56] References Cited

U.S. PATENT DOCUMENTS

| | | | |
|---|---|---|---|
| 1,750,831 | 3/1930 | Carns | 204/24 |
| 3,346,466 | 10/1967 | Golden | 204/28 |
| 3,759,799 | 9/1973 | Reinke | 204/11 |
| 3,862,018 | 1/1975 | Mentone | 204/24 |

Primary Examiner—T. M. Tufariello
Attorney, Agent, or Firm—Kenyon & Kenyon

[57] ABSTRACT

Process for making photochemically coated screen printing fabrics for the production of screen printing cylinders which consist of a chromium steel wire fabric. The chromium steel wire fabric is nickel-plated and a photosensitive emulsion is applied to one side of the nickel-plated chromium steel wire fabric.

11 Claims, 7 Drawing Figures

PROCESS FOR MAKING SCREEN PRINTING FABRICS FOR SCREEN PRINTING CYLINDERS

This invention relates to a process and to devices for the continuous production of photochemically coated screen printing fabrics from which screen printing cylinders for rotary screen printing can be produced.

The classical screen printing process is an intermittent process in which a screen clamped in a frame is lowered onto the stationary surface to be printed, and the ink is spread, by means of a squeegee moved back and forth on the screen, through the screen openings not covered by the negative printing image and applied to the surface to be printed. In that method, the screen consists of a more or less flexible fabric held in a state of tension by the frame.

On account of the intermittent method, the classical screen printing process is unsuitable for use in high-speed and therefore rotary printing machines that are provided with a plurality of printing mechanisms using different printing methods, and possibly with other processing stations, since it requires a change-over of the rotary process to an intermittent process. It has therefore been proposed to develop screen printing processes by means of rotary screen printing cylinders having a stationary squeegee in the interior of the cylinder. However, in so doing, there arose the problem of the production of stable, distortion-free cylinders which are necessarily of a material consisting of a fabric that has inherently no or only slight resistance to the rolling off of a cylinder jacket prepared therefrom against a counterpressure cylinder, and that cannot be substantially strengthened by the application of a photosensitive layer, respectively that loses again in strength after the washing out of the unexposed areas.

In the German Offenlegungsschrift (DE-OS) No. 2,728,084 it has therefore been proposed to shrink a nonmetallic gauze hose onto a supporting sleeve consisting of a large-mesh width metallic fabric and to secure it thereto electrolytically, and then to provide the gauze hose surface with a sensitive layer. However, this method has the disadvantage that it requires individual manufacture.

Another drawback of the prior-art coatings of screen printing fabrics, which the aforementioned method does likewise not overcome, resides in that an even coat surface cannot be obtained on the irregular fabric. During coating of the fabric and subsequent drying of the sensitive layer, the photosensitive emulsion or solution penetrates into the openings of the fabric, so that an even and uniformly thick sensitive layer is not formed. This drawback, inherent in all screen coating methods, cannot be obviated not even by the use of thixotropic emulsions, as had been suggested by Kyle, "Der Siebdruck", No. 8/84, for, if the thixotropicity is too low, the emulsion will penetrate just as it used to; if, however, the thixotropicity is too high, a satisfactory degassing of the fabric will not be possible.

The U.S. Pat. No. 3,759,799 discloses a method of making screen printing cylinders consisting of a steel fabric secured between end plates, a method by which the aforementioned drawbacks are to be overcome. According to that process, a fabric surface made of stainless steel wire with a mesh width predetermined for the thickness of the screen print is first arranged in front of a polished stainless steel plate serving as cathode, and the plate with the fabric arranged in front of it is then electrolytically nickel-plated. After nickel-plating, the fabric surface which is now bonded to a nickel film formed on the cathode, is stripped from the polished steel surface, the film side of the fabric is evenly coated with a photochemical layer, exposed with the print image, and developed. After washing away of the unexposed areas, the open surfaces of the nickel film are now etched until the steel fabric is bared.

This prior-art process has not only the drawback that a plurality of process steps are required and that the screen stencils can be produced individually only, but, above all, the drawback that, as a result of the etching of the nickel coating, not only the resistance of the screen printing surface may again be weakened, but the rigidifying of the points of intersection of the steel fabric brought about by the nickel plating may be etched away as well. It is disadvantageous, above all, that the etching requires maximum accuracy with regard to the concentration of the etching agent and the duration of the etching, which can be achieved by highly qualified professionals only.

The object of the invention is, on the one hand, to find a process for the making of photochemically coated material for the production of screen printing cylinders that do not only obviate the drawbacks of the prior-art methods, but that permit even the continuous making of such material.

The solution of this object is viewed in a process wherein a chromium steel wire fabric of suitable mesh width is nickel-coated solely electrolytically, chemically, or by vacuum deposition to such an extent that the points of intersection of the fabric are secured so that they cannot be displaced, and the rigidized material is then coated with one or several layers of photosensitive emulsion or solution by applying the emulsion or solution to an even surface and embedding the fabric into the back side of the emulsion or solution layer, as well as bonding them by the application of an additional emulsion layer, in such a way that an even sensitive layer is produced on the printing side surface of the screen stencil. In this way, a material is obtained which, even after developing and washing out of the unexposed areas, will retain its strength required for making a screen printing cylinder, but which, after coating and drying of the sensitive layer, will have at the same time an even printing surface which prevents the ink from suffusing the printing surface and permits printing with high resolution. By means of such stencils and screen printing cylinders formed therefrom, screen prints can be obtained of a finess which, if only because of the stretching of the printing screen by the squeegee movement and the resultant displacement of the screen openings, could hitherto not be achieved.

The rigidizing of the fabric is accomplished preferably by electrolytic coating with nickel, with the chromium steel wire fabric in the form of a web being endlessly passed continuously through an electrolytic immersion bath in which the fabric web serves directly as cathode.

Preferably, one uses a chromium steel wire fabric in linen binding and having a mesh number of from 250 to 500 and a wire diameter of from 5 to 50$\mu$. Preferably, a 2 to 20 $\mu$ thick nickel coating is applied to the chromium steel wire fabric.

As a result of a more or less prolonged nickel plating of the fabric, beyond the nickel plating required for rigidizing the web of fabric, the mesh width essential for the amount of ink to be applied can be affected in that the steel wires of the chromium steel fabric are coated with a predetermined mesh-width-limiting nickel layer. Thus, one avoids using, a priori, fabrics of different mesh widths for ink applications of different thicknesses. Moreover, by using the finest material whose mesh width can no longer be reduced during weaving, a further reduction of the mesh width can be achieved without having to use a material whose original strength is already impaired by the small diameter of the steel wires used.

In the further course of the process the web of nickel-plated chromium steel fabric is continuously coated with one or several layers of a photosensitive emulsion or solution in such a way that an even sensitive layer is formed.

To form an even sensitive layer, the photosensitive emulsion or solution is preferably applied onto a moved, heated even surface, and, during the drying process of the emulsion or solution, the nickel-plated web of chromium steel fabric is conveyed onto the back side of the sensitive layer which is being formed and, through the application of another emulsion or solution layer, is bonded to the sensitive layer.

This process is suited in particular for thick sensitive layers, where it is of advantage to smooth the back side of the web of chromium steel fabric and the layer situated thereon by suitable means to permit a vibration-free movement of the squeegee and to reduce squeegee wear.

The second emulsion or solution layer can preferably be applied between the web of fabric and the first coating during the feeding of the web of chromium steel fabric. In this way, the emulsion or solution is forced out through the screen openings by the web of chromium steel fabric that is being taken up, and the fabric degassed, and the formation of tiny bubbles or gas inclusions prevented.

By contrast, in the case of very thin sensitive layers it is of advantage, instead of the second coating, to wet the dried-on first sensitive layer only with water or solvent in such a way that the web of chromium steel fabric can adequately bond to the sensitive layer.

To prevent the risk of inadequate stripping of the sensitive layer from the heated even surface if the latter is not sufficiently polished, it proved to be advantageous in the forming of the sensitive layer to apply photosensitive emulsion or solution onto a protective film, preferably of polyester, which is passed over the heated even surface. After drying out of the coated screen printing fabric, the protective film can be stripped. Preferably, the protective film remains however on the sensitive layer until the latter is exposed, because the sensitive layer is protected by the film against mechanical or chemical injury.

Commercially available sensitive layers, which are applied to a film, can also be used. In that case, in order to bond the sensitive layer to the web of chromium steel fabric, the back side of the sensitive layer is activated by wetting, or a layer of emulsion or solution is applied.

The resultant web-like material provided with a photosensitive layer can subsequently be cut into sheets and packed and stored in a lightproof manner. After suitable exposure with the respective print image, developing and washout, the material can be shaped into cylinder jackets from which the screen printing cylinders can be made with the use of end plates.

A further object of the invention is to find devices for the rigidizing by nickel plating and for coating the rigidized web-like fabric.

The device for continuous nickel-plating consists of a plurality of immersion baths for cleaning and degreasing the web of chromium steel fabric, and an electrolytic immersion bath for nickel-plating through which the web of fabric is continuously passed by means of rollers. Arranged in the electrolytic immersion bath is a cylinder with nonconducting surface, dipped to up to one-half into the immersion bath. Upstream of the cylinder there is arranged a negatively-poled electrical contact roller through which the electric currents originating from the anode placed in the electrolytic immersion bath and conducted through the web of fabric can be led away.

The cylinder has preferably a rather large diameter; it is vertically displaceable and has a polished surface.

As a result of the large diameter and hence the large circumference of the cylinder, one achieves that the chromium steel fabric web is fully supported during the nickel-plating process. In this way, corrugations and their hardening, which cannot be prevented when the web of fabric is conveyed without support, can be prevented.

Owing to the vertical displaceability of the cylinder, the residence time of the chromium steel fabric web in the immersion bath can be changed without changing the speed of the continuous nickel-plating unit.

As a result of the polished surface of the nonconducting cylinder one achieves that the nickel-plating on the back side of the web of the chromium steel fabric will be somewhat flattened in the area of the wires. This flattening is of advantage for a smoother, vibration-free operation of the squeegees in the finished screen printing cylinder.

Furthermore, upstream of the immersion bath there is arranged a width-adjusting device, preferably in the form of a cambered roller, to guide the fabric that, before nickel-plating, can be easily displaced, onto the immersion bath cylinder in a rather stretched condition.

The coating device for the production of the sensitive layer and for bonding the sensitive layer to the rigidized chromium steel fabric web consists of one or a plurality of heated cylinders, one or a plurality of coating devices arranged opposite the heated cylinder or cylinders, a feed roller for the nickel-plated chromium steel fabric web, and a forward feed for conveying the web around the drying cylinder or cylinders. Preferably, only one heated cylinder of large circumference is used, around which there are arranged a film pay-out device, a coating device, a feeding device, another coating device, and a take-off device.

The second coating device is preferably arranged at a distance from the first coating device that permits the adhering by drying of the first layer over the peripheral segment of the cylinder.

Especially in the case of fabrics of small mesh width it has proven to be advantageous to arrange the second coating device directly before the feeding device of the nickel-plated chromium steel fabric web, to achieve a satisfactory degassing of the web.

Downstream of the feeding device a calender roller can be arranged, in order to additionally smooth the back side of the sensitive layer.

In the case of very thin sensitive layers it is advantageous, instead of a second coating, to activate the sensitive layer solely by means of a wetting device so as to obtain an adequate bonding to the chromium steel fabric web.

The feeding of a polyester film can be dispensed with if the drying cylinder or cylinders are polished in such a way that the composite of nickel-plated fabric web and dried photosensitive emulsion or solution can be stripped from the drying cylinder.

The device has the advantage that by producing an absolutely plane sensitive layer on the drying cylinder, a satisfactory print image transfer is possible.

For further illustration of the invention, reference is had to the exemplified embodiment of the devices according to the invention, shown in the annexed drawings in which.

Figure 1:
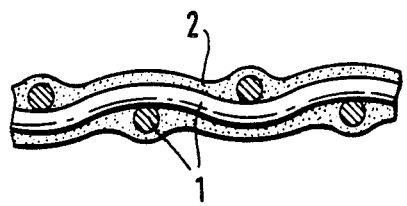
FIG. 1 shows a cross-section through a screen printing stencil provided with a sensitive layer.

The screen printing stencil illustrated in FIG. 1 consists of the fabric 1 and the sensitive layer 2. It can be seen from the drawing that at none of the two surfaces there exists an even area that would prevent the suffusing of the printing surface.

Figure 2:
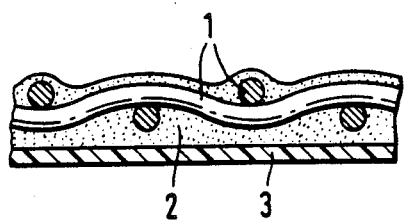
FIG. 2 shows a cross-section through a screen printing stencil provided with a sensitive layer according to the invention.

By contrast, the screen printing stencil according to the invention, shown in FIG. 2, has a protective film 3, and it is precisely thereto that the sensitive layer is applied. The protective film 3, which protects the sensitive layer against mechanical and chemical effects, is removed only immediately prior to exposure of the sensitive layer.

Figure 3:
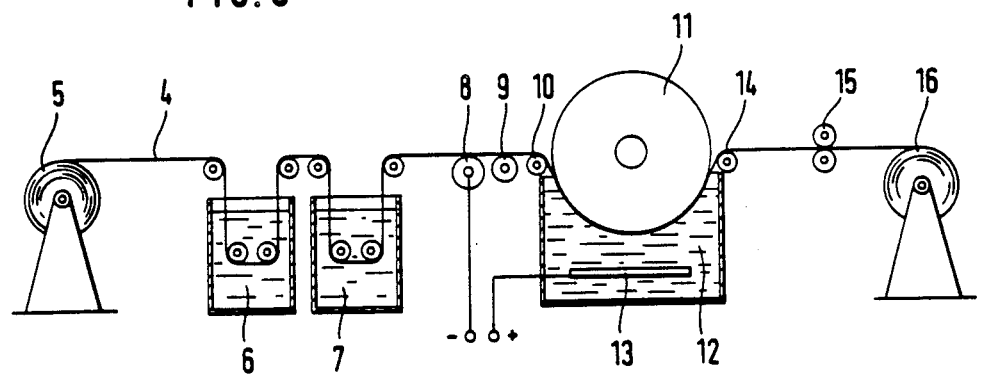
FIG. 3 is a schematic representation of the nickel-plating plant.

The device schematically illustrated in FIG. 3 for nickel-plating the fabric web 4 composed of a chromium steel fabric having a mesh number of 250 to 500μ [sic!] and a wire diameter of from 15 to 30μ consists of a pay-out device 5, cleaning and preparation baths 6, 7 shown by way of example, a negatively-poled contact roller 8, a width adjusting device 9, here in the form of a cambered roller, a deflection roller 10 for introducing the fabric web 4 into the electrolytic immersion bath 12, a delivery roller 14, a forward feed 15, and a take-up device 16. Arranged in the immersion bath 12 is a large guide roller 11 whose surface is provided with a polished nonconducting layer. An anode 13 is arranged in the immersion bath 12.

After being cleaned and degreased in the immersion baths 6 and 7, the fabric web 4 is conveyed by the guide roller 10, via the contact roller 8 and the width-adjusting device 9, to the cylinder 11 in the immersion bath 12. The fabric web 4 is the cathode on which the nickel ions, separated from the anode 13 as a result of the galvanization process, deposit, and where, depending on the residence time of the fabric web 4 in the immersion bath 12 and on the other galvanization parameters, they form a uniform coating on the fabric, with the exception of the back side of the wires applying against the cylinder, consisting of a 5 to 20 μ thick nickel layer. The fabric web 4 is pulled out of the immersion bath 12 by the forward feed 15 via the delivery roller 14, and, after drying and any aftertreatment that may be required, is wound up on the take-up device 16.

The fabric web 4 of a chromium steel fabric woven in a linen binding is rigidified by the nickel-plating in such a way that it satisfies the requirements concerning the stability as screen printing cylinder and its static-dynamic stresses.

Figure 4:
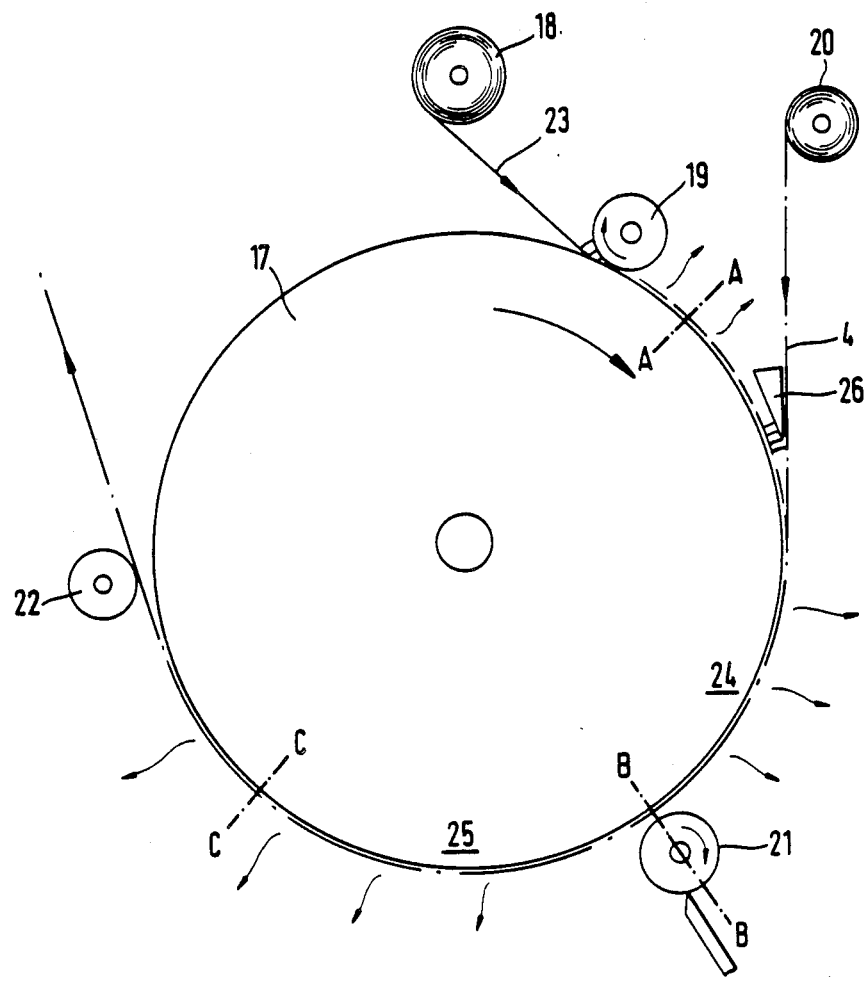
FIG. 4 is a schematic representation of the coating unit.

The coating device schematically illustrated in FIG. 4 consists of a heated cylinder 17, a pay-out device 18 for the protective film 23, a first coating roller 19, a pay-out device 20 for the fabric web 4, a second coating roller 21, and a take-off device 22 with advance feed (not shown). Situated between the coating rollers 19 and 21 is the adhering-by-drying segment 24 and between the coating roller 21 and the take-off device 22 the drying segment 25.

The heating of the cylinder 17 is designed in such a way that temperatures of 40° C. are not exceeded, so as not to damage the sensitive layer of photosensitive emulsion or solution which forms on the cylinder 17.

Figure 5:
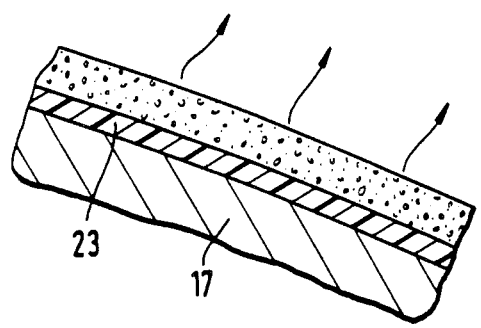
FIG. 5 is a view taken along line A—A.

For coating, the protective film 23 of lowest possible thickness, which preferably consists of polyester, is conveyed by the film pay-out device 18 to the cylinder 17 and coated with a first emulsion layer of predetermined thickness by means of the coating roller 19 which rotates in a direction opposite that of the cylinder 17. During the coating process it should be taken into account with regard to the final thickness of the sensitive layer that, in view of the solids content of the emulsion, the thickness of the wet film must be a multiple of the desired thickness of the sensitive layer, as shown in FIG. 5. Hence, to obtain a sensitive layer thickness of from 8 to 40μ, it is necessary, in view of the approximately 30% solids content of the emulsion, to apply a wet film having a thickness of from 30 to 150μ.

Figure 6:
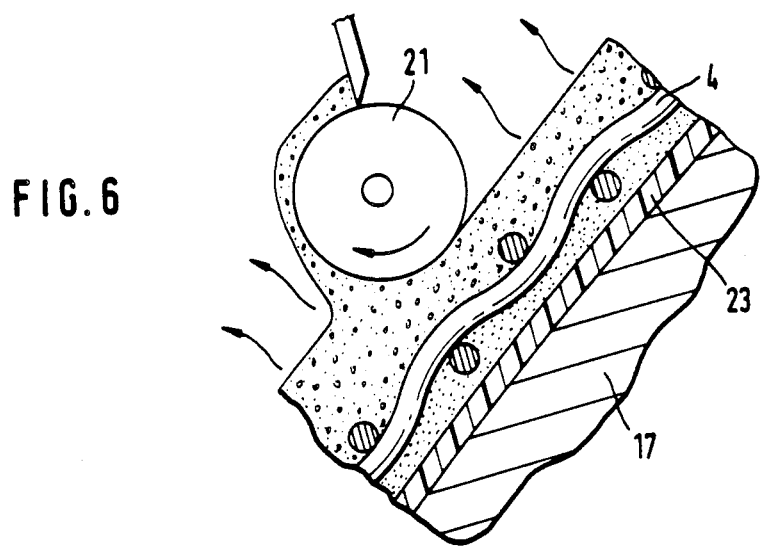
FIG. 6 is a view taken along line B'B.
Figure 7:
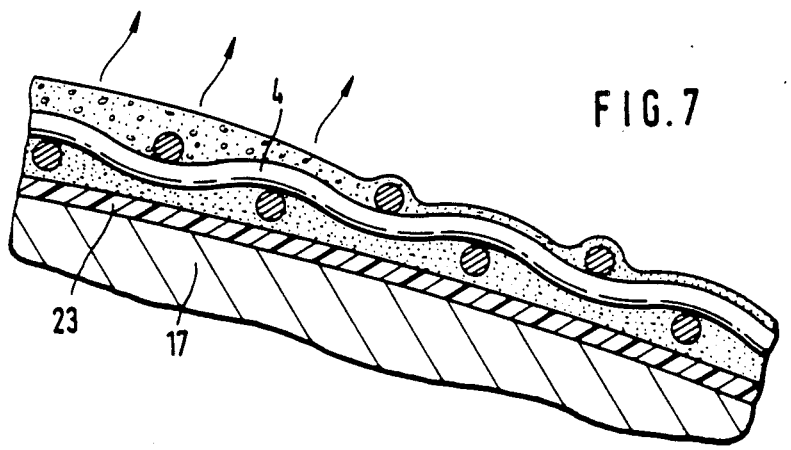
FIG. 7 is a cross-section through the web along line C—C.

The fabric web 4 is then conveyed by the pay-out device 20 to the cylinder 17. In so doing, care should be taken that the tension of the fabric web is kept low to prevent an overly deep penetration into the sensitive layer which is in the process of adhering while drying. By means of the coating roller 21 (FIG. 6), the back side of the fabric web 4 is then coated with a second layer of emulsion which bonds to the first layer through the openings of the fabric web 4. The composite of protective film 23, the fabric web 4, and the emulsion layers is then fully dried during passage over the drying segment 25 (FIG. 7), and conveyed via the take-off device to further processing.

According to another exemplified embodiment, the second emulsion layer is applied by means of the metering device 26 between the first layer and the fabric web 4, whereby the emulsion is forced from the inside through the openings of the fabric web 4. This has the advantage of ensuring a better degassing of the fabric web 4. In this case, the subsequent metering roller 21 is used only for removing excess emulsion from the back side of the fabric web 4 and for smoothing the layer on the back side.

According to another exemplified embodiment, the application of a second emulsion layer can be dispensed with entirely. In this case, the first emulsion layer, dried substantially along the adhering-by-drying segment 24, is wetted by the metering roller 21 only with water or solvent, in order to dissolve the layer superficially and to obtain an adequate bonding to the fabric web 4.

The structure of the screen printing stencil will be determined by the purpose for which it is intended, namely, the thickness of the screen printing ink layer to be produced and the resolution of the print image.

The amount of ink applied is determined by the amount of ink situated in the screen openings. This amount of ink is a function of the elevation of the screen openings, in other words, substantially of the thickness of the screen printing stencil.

It has been found that to obtain a full-tone print the sensitive layer should be as thick as possible, and the nickel-plated fabric layer should be large-meshed and as high as possible. The height can be achieved by a suitably intense nickel-plating of the web of fabric.

By contrast, to obtain a print of high resolution, it is advantageous to work with a thin sensitive layer on a tight-meshed fabric with slight nickel-plating serving solely for rigidifying the woven structure.

In accordance with the invention, the following parameters are used:
Fabric: 250 to 500 mesh=100 to 200 filaments per cm.;
Wire diameter: 5 to 50$\mu$;
Nickel layer: 2 to 20$\mu$.

To determine the ink layer thickness, 1½ to 5 times the depth of the screen opening (step depth) is calculated, depending on the ink to be used. According to experience, the degree of emptying of the steps is limited to 80 to 90%. The thickness of the chromium steel fabric amounts to up to about 2½ times the wire diameter, because the wires in the linen binding depending on their thickness and the mesh width, are not directly superjacent.

In the case of screen stencils according to the above parameters, the area of the screen openings ranges from 5 to 40% of the total screen area.

The design of screen stencils for different applications is explained further by the following exemplified embodiments:

Task 1:
Brilliant surface print (uniform full-tone print) with 30 $\mu$ U.V. ink layer (wet dry)
Solution 1:
Mesh width: 250/inch=100/cm.;
Wire diameter: 36$\mu$;
Nickel layer: 6–8$\mu$;
Sensitive layer: 20$\mu$;
Stencil thickness: 95 to 100$\mu$;
Screen opening: 35%.

At 80 to 90% step emptying, this results in an ink layer of from 20 to 30$\mu$.

Task 2:
Thin ink layer with high resolution
Solution 2:
Mesh width: 500/inch=200/cm;
Wire diameter: 20$\mu$;
Nickel layer: 6–8$\mu$;
Sensitive layer: 10$\mu$;
Stencil thickness: 65–70$\mu$;
Screen opening: 8–10%.

In this case, the thickness of the stencil is virtually immaterial for the ink layer thickness: only the thickness of the sensitive layer is of importance. Thus, at 80% step emptying, a resolution of from 50 to 70$\mu$, i.e., diameter of dot or width of a line, and an ink dot elevation of from 6 to 8$\mu$, are achieved.

A screen printing stencil according to the preceding example permits screen printing in the 54-line screen with 10 to 90% ink coverage, which is a level of book printing quality that is not attainable with prior-art screen printing methods. This is due on the one hand to the possible reduction of the screen openings through the nickel plating, and, on the other hand, to the edge sharpness, which is achieved as a result of the even sensitive layer. In conventional coating processes, the surface of the sensitive layer follows the corrugations of the fabric wires, which gives rise to the saw-tooth in the print image that is characteristic of conventional screen printing.

We claim:

1. Process for making photochemically coated screen printing fabrics for the production of screen printing cylinders, consisting of a chromium steel wire fabric, characterized in that the chromium steel wire fabric is nickel-plated, and an even sensitive layer consisting of at least one layer of photosensitive emulsion is applied to one side of the nickel-plated chromium steel wire fabric.

2. Process according to claim 1, characterized in that the chromium steel wire fabric in web form is endlessly nickel plated continuously in an electrolytic immersion bath, with the chromium steel fabric web serving as cathode.

3. Process according to claim 1 characterized in that the chromium steel wire fabric is in linen binding and has a mesh number of from 250 to 500 and a wire thickness of from 5 to 50 microns.

4. Process according to claim 1, characterized in that a nickel coating of from 2 to 20 microns thickness is applied onto the chromium steel wire fabric.

5. Process according to claim 1, characterized in that the web of nickel-plated chromium steel fabric is moved and is coated continuously with at least one layer of a photosensitive emulsion.

6. Process according to claim 5, characterized in that after adhereing by drying of the sensitive layer and the feeding of the web of nickel-plated chromium steel fabric, the sensitive layer is wetted with a solvent.

7. Process according to claim 1, characterized in that to form an even sensitive layer, photosensitive emulsion is applied onto a protective film which is passed over a heated even surface.

8. Process according to claim 1, characterized in that a sensitive layer having a dry thickness of from 5 to 80 microns is applied onto the web of nickel-plated chromium steel fabric.

9. Process according to claim 5, characterized in that the web of nickel-plated chromium steel fabric is bonded to a dry sensitive layer applied to a film, by activation of the sensitive layer by means of a photosensitive emulsion.

10. A process formaking photochemically coated screen printing fabrics for the production of screen printing cylinders, comprising nickel-plating a chromium steel wire fabric web and applying an even sensitive layer of a photosensitive emulsion to one side of the nickel-plated chromium steel wire fabric web while it is moving said layer being applied continuously to said side by being applied to a moving, heated even surface to which the web is pressed while drying the emulsion to form the layer, the layer being bonded in place by the application of a second emulsion layer thereto.

11. Process according to claim 10, characterized in that a second emulsion layer is applied between the sensitive layer and the web of fabric during the feeding of the web of nickel-plated chromium steel fabric.

* * * * *